United States Patent
Shimizu et al.

(10) Patent No.: US 12,108,525 B2
(45) Date of Patent: Oct. 1, 2024

(54) FLEXIBLE PRINTED BOARD HAVING IMPROVED RECOGNITION ACCURACY

(71) Applicant: Yazaki Corporation, Tokyo (JP)

(72) Inventors: Hidehiko Shimizu, Shizuoka (JP); Tomohiro Sugiura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/578,596

(22) Filed: Jan. 19, 2022

(65) Prior Publication Data
US 2022/0272829 A1    Aug. 25, 2022

(30) Foreign Application Priority Data

Feb. 19, 2021   (JP) .................................. 2021-025103

(51) Int. Cl.
*H05K 1/02*      (2006.01)
*H05K 1/18*      (2006.01)

(52) U.S. Cl.
CPC ........... *H05K 1/028* (2013.01); *H05K 1/0269* (2013.01); *H05K 1/186* (2013.01); *H05K 2201/09918* (2013.01)

(58) Field of Classification Search
CPC ...... H05K 1/028; H05K 1/0269; H05K 1/186; H05K 2201/09918
See application file for complete search history.

(56) References Cited

U.S. PATENT DOCUMENTS

| | | | | |
|---|---|---|---|---|
| 7,835,159 B2 * | 11/2010 | Mishiro | ................. | H05K 3/361 |
| | | | | 361/755 |
| 9,111,706 B2 * | 8/2015 | Chen | .................... | H05K 1/0269 |
| 2006/0134409 A1 | 6/2006 | Pecorini et al. | | |
| 2006/0265870 A1 * | 11/2006 | Gotou | .................. | H05K 1/0269 |
| | | | | 29/846 |
| 2008/0030666 A1 * | 2/2008 | Abe | .................... | G02F 1/13452 |
| | | | | 361/679.02 |
| 2009/0007421 A1 * | 1/2009 | Chen | ..................... | H05K 3/281 |
| | | | | 29/825 |

(Continued)

FOREIGN PATENT DOCUMENTS

| | | | | |
|---|---|---|---|---|
| CN | 107278023 A | * | 10/2017 | .......... H05K 1/0266 |
| CN | 107683011 A | * | 2/2018 | |

(Continued)

*Primary Examiner* — Jeffrey T Carley
*Assistant Examiner* — Jose K Abraham
(74) *Attorney, Agent, or Firm* — Sughrue Mion, PLLC (57) ABSTRACT

An objective of the present invention is to prevent a copper foil used as a recognition mark from being stripped from a base film in a flexible printed board while preventing the recognition accuracy for the recognition mark from being reduced. A flexible printed board includes a base film; a copper foil pattern on the base film, wherein the copper foil pattern has a hollow shape with an outer circumferential section and an inner circumferential section and is configured to function as a recognition mark; a coverlay having an opening formed therein, wherein the coverlay is bonded to the base film and covers the outer circumferential section of the copper foil pattern such that an edge of the opening is positioned between the outer circumferential section and the inner circumferential section of the copper foil pattern.

6 Claims, 5 Drawing Sheets

(56) References Cited

U.S. PATENT DOCUMENTS

| | | | |
|---|---|---|---|
| 2012/0069538 A1* | 3/2012 | Ihara | H05K 1/0269 174/250 |
| 2012/0293974 A1* | 11/2012 | Asano | H05K 1/141 361/784 |
| 2014/0027861 A1* | 1/2014 | Han | H01L 24/81 257/797 |
| 2014/0111729 A1* | 4/2014 | Que | G02F 1/1345 349/56 |
| 2014/0174796 A1* | 6/2014 | Watanabe | H05K 1/0266 174/254 |
| 2016/0198564 A1* | 7/2016 | Hatazawa | H05K 1/0298 174/251 |
| 2021/0191183 A1* | 6/2021 | Gao | H05K 3/32 |
| 2023/0007779 A1* | 1/2023 | Shimizu | H05K 3/281 |

FOREIGN PATENT DOCUMENTS

| | | | | |
|---|---|---|---|---|
| CN | 111212513 A | | 5/2020 | |
| JP | 2001-007460 A | | 1/2001 | |
| JP | 2002-185102 A | | 6/2002 | |
| JP | 2005244182 A | * | 9/2005 | G03F 9/7076 |
| JP | 3716178 B2 | * | 11/2005 | |
| JP | 2007121425 A | * | 5/2007 | G03F 7/70425 |
| JP | 2008016758 A | * | 1/2008 | H05K 1/0269 |

\* cited by examiner

FLEXIBLE PRINTED BOARD HAVING IMPROVED RECOGNITION ACCURACY

BACKGROUND OF THE INVENTION

Technical Field

The present invention relates to a flexible printed board, and more particularly to a recognition mark in a flexible printed board.

Background Art

Recognition marks are used in order to increase a mounting accuracy for automatically mounting electronic devices to printed boards. In a pick-and-place machine, a position of a printed board can be known accurately by reading the recognition mark in the printed board with a camera and by applying image recognition.

Figure 7:
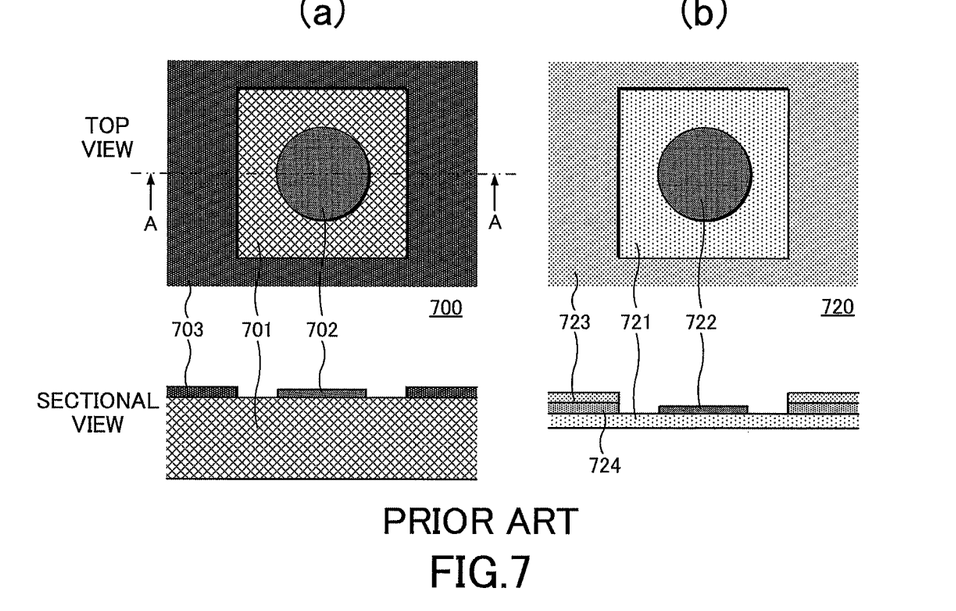
FIG. 7 shows a conventional recognition mark.

FIG. 7 shows a top view of a recognition mark 702 in a rigid printed board 700 and a sectional view thereof along the A-A line in (a). Similarly, each of the following sectional views shall be shown along a section line including a central portion of a recognition mark. In the example as shown in this figure, the recognition mark 702 is formed in the form of a copper foil pattern on a rigid board 701, wherein a circular shape can be recognized in the top view as seen from a top side. Aboard 701 is exposed around the recognition mark 702, wherein the board 701 is covered with a resist 703 around the exposed region of the board 701.

A similar structure is often applied in the case of applying a recognition mark to a flexible printed board. Further, FIG. 7 shows a top view of a recognition mark 722 in a flexible printed board 720 and a sectional view thereof in (b). In the example as shown in this figure, the recognition mark 722 is formed in the form of a copper foil pattern on a base film 721, wherein a circular shape can be recognized in the top view as seen from a top side. The base film 721 is exposed around the recognition mark 722, wherein a coverlay 723 is applied to the base film 721 around its exposed region by means of an adhesive 724.

CITATION LIST

Patent Literature

Patent Document 1: JP 2001-7460 A

SUMMARY OF THE INVENTION

Generally, such a flexible printed board 720 is often used for a movable element and/or used by being bent. In such a situation, it is necessary, in particular to prevent a copper foil used as the recognition mark 722 from being stripped from the base film 721 which may form a conductive foreign substance.

Figure 8:
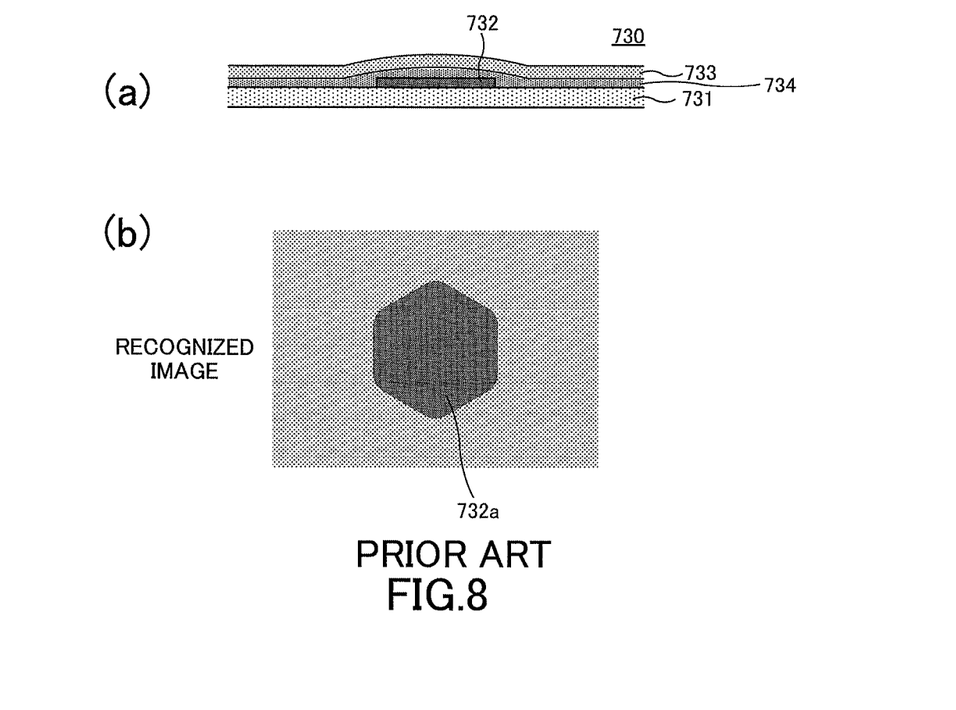
FIG. 8 shows a recognition mark and a corresponding recognized image, wherein the recognition mark is covered on its entire surface.

Therefore, it could be conceivable to apply a coverlay 733 to a base film 731 by means of an adhesive 734 such that a recognition mark 732 formed on the base film 731 is covered with the coverlay 733 on the entire surface of the recognition mark 732, as shown in a sectional view in (a) of FIG. 8. This enables the copper foil used as the recognition mark 732 to be prevented from being stripped from the base film 731.

However, in the case where the recognition mark 732 is covered with the coverlay 733 on the entire surface of the recognition mark 732, it may result in the coverlay 733 being slightly curved due to a thickness of the copper foil pattern. When the recognition mark 732 is read through the curved coverlay 733 by a camera of a pick-and-place machine, the circular recognition mark 732 may appear as a hexagonal mark 732a as shown in (b) of FIG. 8, whereby the recognition accuracy is reduced.

Therefore, an objective of the present invention is to prevent a copper foil used as a recognition mark from being stripped from a base film in a flexible printed board while preventing the recognition accuracy for the recognition mark from being reduced.

In order to achieve this objective, a flexible printed board according to a first aspect of the present invention includes a base film; a copper foil pattern on the base film, wherein the copper foil pattern has a hollow shape with an outer circumferential section and an inner circumferential section and is configured to function as a recognition mark; a coverlay having an opening formed therein, wherein the coverlay is bonded to the base film and covers the outer circumferential section of the copper foil pattern such that an edge of the opening is positioned between the outer circumferential section and the inner circumferential section of the copper foil pattern.

According to a second aspect of the present invention, a flexible printed board includes a base film with an optical transmissivity; a copper foil pattern on a first face of the base film, wherein the copper foil pattern is configured to function as a recognition mark; a first face coverlay covering the copper foil pattern and bonded to the first face of the base film; and a second face coverlay having a larger opening formed therein than the copper foil pattern, wherein the second face coverlay is bonded to a second face of the base film such that the copper foil pattern is contained within the opening when viewed through the base film.

According to a third aspect of the present invention, a method of producing a flexible printed board includes forming a copper foil pattern on a base film, the copper foil pattern having a hollow shape with an outer circumferential section and an inner circumferential section; and bonding a coverlay having an opening to the base film so as to expose the inner circumferential section of the copper foil pattern while covering the outer circumferential section.

According to a fourth aspect of the present invention, a method of producing a flexible printed board includes forming a copper foil pattern on a first face of a base film with an optical transmissivity; covering the copper foil pattern with a first face coverlay and bonding the copper foil pattern to the first face of the base film; and bonding a second face coverlay to a second face of the base film, wherein the second face coverlay has a larger opening formed therein than the copper foil pattern, wherein the bonding the second face coverlay to the second face of the base film is performed such that the copper foil pattern is contained within the opening when viewed through the base film.

With the present invention, it is possible to prevent a copper foil pattern used as a recognition mark from being stripped from a base film in a flexible printed board while preventing the recognition accuracy for the recognition mark from being reduced.

DETAILED DESCRIPTION OF THE PREFERRED EMBODIMENTS

Figure 1:
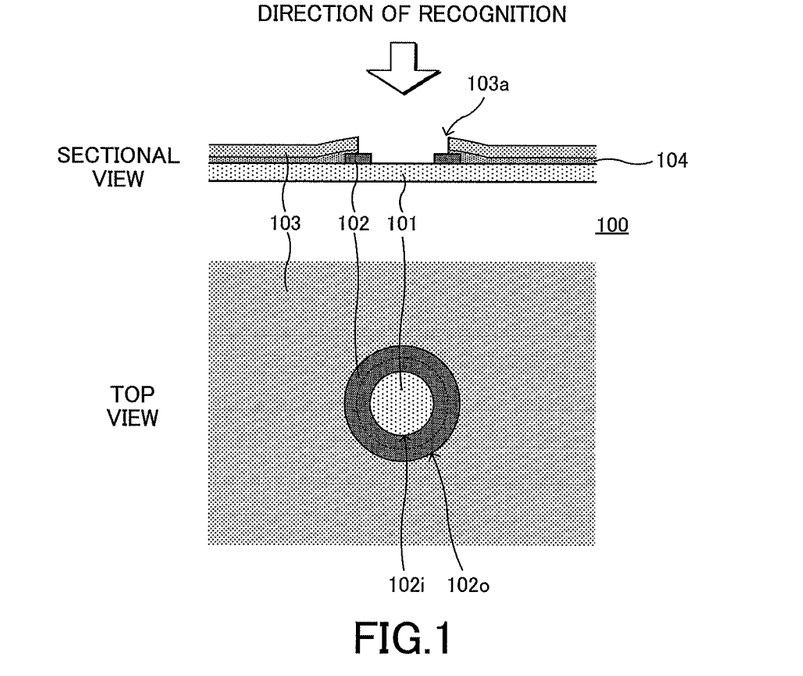
FIG. 1 shows a recognition mark in a flexible printed board according to a first example.

Embodiments of the present invention will be described in more details with reference to the Drawings. FIG. 1 shows a sectional view and a top view of a recognition mark 102 in a flexible printed board 100 according to a first example selected from embodiments of the present invention.

As described below, during mounting components, the flexible printed board 100 according to the present example enables a recognition accuracy of the recognition mark to be prevented from being reduced, wherein during use, it is further possible to prevent a copper foil pattern used as the recognition mark from being stripped from a base film. Therefore, the flexible printed board 100 can be applied advantageously, particularly in an environment where the flexible printed board 100 is subject to vibrations and/or installed by being bent, e.g. for a on-board flexible printed board for a vehicle. The same applies to other examples of flexible printed board.

As shown in FIG. 1, the flexible printed board 100 according to the first example includes a recognition mark 102 formed in the form of a copper foil pattern on a base film 101. The recognition mark 102 has a hollow shape with an outer circumferential section 102o and an inner circumferential section 102i, wherein the outer circumferential section 102o and the inner circumferential section 102i are concentrically circular in the example as shown in FIG. 1.

As shown by an arrow which is indicative of a direction of recognition, the recognition mark 102 is configured to be recognized from above in the sectional view of FIG. 1, and formed on a face of the base film 101 for recognition. Furthermore, a face of the recognition mark 102 facing the base film 101 is in contact with the base film 101 in all regions of this face.

The outer circumferential section 102o is covered with a coverlay 103 along the entire circumferential extension of the outer circumferential section 102o. On the other hand, the inner circumferential section 102i is not covered with the coverlay 103 along the entire circumferential extension of the inner circumferential section 102i, wherein an inner circumferential portion of the recognition mark 102 is exposed, and the base film 101 is exposed in a region inside the inner circumferential section 102i. This means that the coverlay 103 has an opening 103a formed therein for exposing the inner circumferential section 102i. In the example as shown in FIG. 1, the opening 103a is concentrically circular with the inner circumferential section 102i, as indicated by a dotted circle in the top view. The coverlay 103 is applied to the base film 101 (and an outer circumferential region of the recognition mark 102) by means of an adhesive 104.

Figure 2:
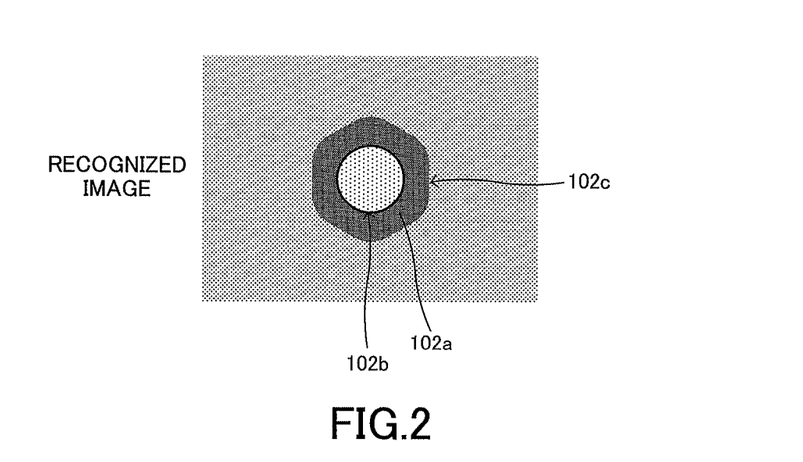
FIG. 2 shows a recognized image of the recognition mark according to the first example.

When the recognition mark 102 according to the present example is read by a camera of a pick-and-place machine, the recognition mark 102 will be recognized as shown in a recognized image according to FIG. 2. In this figure, the outer circumferential section 102o which is covered with the coverlay 103 appears as a hexagonal shape 102c, and has a reduced recognition accuracy for the recognition mark. However, a circle 102b can be clearly confirmed in the inner circumferential section 102i which is not covered with the coverlay 103, wherein this can serve as a recognition mark with a high recognition accuracy.

Furthermore, even if the copper foil pattern could be stripped in a region which is not covered with the coverlay 103, it is possible to prevent the copper foil from being stripped from the base film 101 since the outer circumferential section 102o is covered with the coverlay 103 along the entire circumferential extension of the outer circumferential section 102o.

For the base film 101 and/or the coverlay 103, a resin with an optical transmissivity is preferably used, such as a polyimide and/or polyester. It is provided that the recognition mark 102 is formed simultaneously with a circuit pattern of the flexible printed board 100, e.g. via copper etching. Furthermore, the opening 103a in the coverlay 103 is formed in advance before bonding it to the base film 101, e.g. by means of a laser cutter.

Thus, the flexible printed board 100 according to the present example may be produced according to the following steps: forming a copper foil pattern on a base film 101, the copper foil pattern having a hollow shape with an outer circumferential section 102o and an inner circumferential section 102i; and bonding a coverlay 103 having an opening 103a to the base film 101 so as to expose the inner circumferential section 102i of the copper foil pattern while covering the outer circumferential section 102o.

While in the above-described example, the inner circumferential section 102i and the outer circumferential section 102o of the recognition mark 102 are concentrically circular, the inner circumferential section 102i and the outer circumferential section 102o are not limited thereto. As shown by way of example, the recognition mark may be formed by a combination of a circle with a polygon such a quadrilateral, pentagon or hexagon, or a combination of polygons (see (a) to (h) in FIG. 3). Furthermore, the recognition mark may have a shape with convex and concave portions ((i) in FIG. 3), an ellipsoidal shape or the like ((j) in FIG. 3), or may be formed by arranging the inner circumferential section 102i and the outer circumferential section 102o eccentrically ((k) in FIG. 3).

Figure 3:
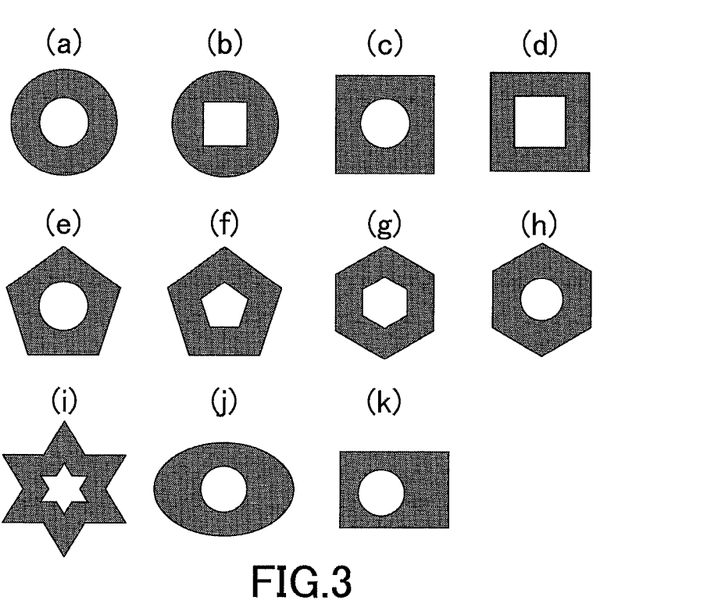
FIG. 3 shows exemplar variations of a shape of the recognition mark according to the first example.

In all of these cases, it is provided so that a shape of the opening 103a in the coverlay 103 corresponds to a shape of the recognition mark, wherein the outer circumferential section of the recognition mark is covered with the coverlay 103 along the entire circumferential extension of the outer circumferential section while the inner circumferential section of the recognition mark is not covered with the coverlay 103 along the entire circumferential extension of the inner circumferential section.

Figure 4:
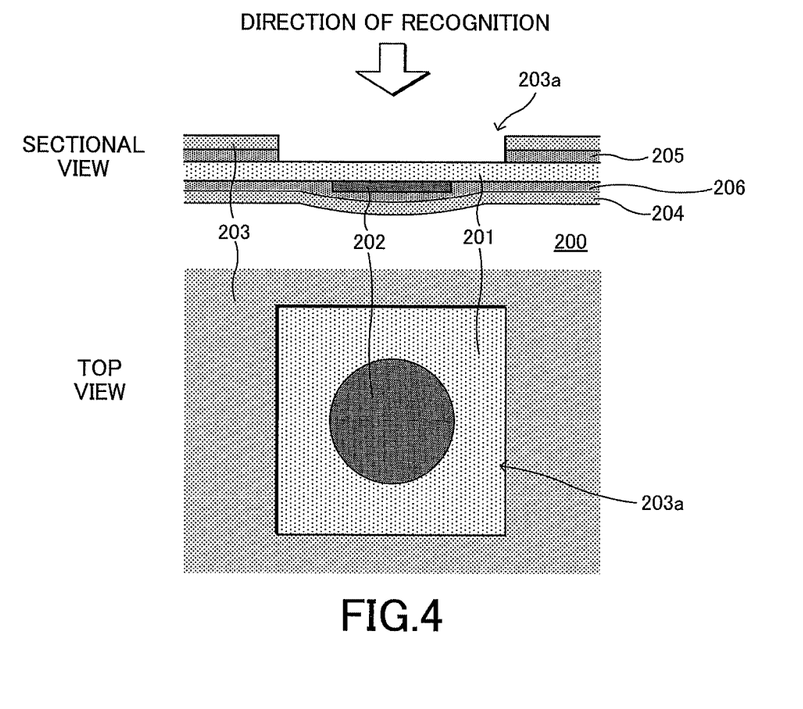
FIG. 4 shows a recognition mark in a flexible printed board according to a second example.

Next, a second example of embodiments of the present invention will be described. FIG. 4 shows a sectional view and top view of a recognition mark 202 in a flexible printed board 200 according to the second example. As shown in this figure, the flexible printed board 200 according to the second example includes the recognition mark 202 which is formed in the form of a copper foil pattern on a base film 201 having an optical transmissivity. The recognition mark 202 has a circular shape. However, the recognition mark is not limited to a circular shape, but may also have a polygonal shape or other.

Assuming that a face of the flexible printed board 200 for recognition of the recognition mark is a top face of the flexible printed board 200, the recognition mark 202 is formed on a bottom face of the base film 201. Furthermore, a face of the recognition mark 202 facing the base film 201 is in contact with the base film 201 in all regions of the face.

The recognition mark 202 is covered with a bottom face coverlay 204 on the entire surface of the recognition mark 202. The bottom face coverlay 204 is applied to the bottom face side of the base film 201 by means of a bottom face adhesive 206.

A top face coverlay 203 is applied to the base film 201 on its top face side by means of a top face adhesive 205. Furthermore, a circuit pattern (not shown) is formed on the top face side of the base film 201 and protected by the top face coverlay 203.

The top face coverlay 203 has a larger opening 203a formed therein than the recognition mark 202 so that the recognition mark 202 can be recognized by viewing it through the base film 201 in the direction of recognition without viewing through the top face coverlay 203. The opening 203a is formed with some margin so that the recognition mark 202 is completely contained within the opening 203a when viewed through the base film 201. While in the example according to FIG. 4, the opening 203a has a rectangular shape, the opening 203a is not limited thereto, but may have a circular or polygonal shape or other.

According to the second example, the recognition mark 202 is formed on a face opposite to the recognition face, wherein the recognition mark 202 can be recognized by viewing it through the base film 201 in the direction of recognition without viewing through the top face coverlay 203. Even when viewed through the base film 201, it is possible to recognize the recognition mark 202 clearly since no curve is generated in the base film 201 due to a thickness of the copper foil pattern, which enables the recognition accuracy to be prevented from being reduced. Furthermore, since the recognition mark 202 on the base film 201 is covered with the bottom face coverlay 204, it is possible to prevent the copper foil from being stripped from the base film 201.

According to the second example, a resin with an optical transmissivity may be used for the base film 201, top face coverlay 203 and/or bottom face coverlay 204, such as a polyimide and/or polyester. It is provided that the recognition mark 202 is formed simultaneously with a circuit pattern of the flexible printed board 200, e.g. via copper etching. Furthermore, the opening 203a in the top face coverlay 203 is formed in advance before bonding it to the base film 201, e.g. by means of a laser cutter. Since the recognition mark 202 according to the second example is formed on the face opposite to the face for recognition, it is suited for the flexible printed board 200 with circuit patterns on both faces of the base film 201.

The flexible printed board 200 according to the second example may be produced according to the following steps: forming a copper foil pattern on the face of a base film 201 which is opposite to the face for recognition, wherein the copper foil pattern forms the recognition mark; covering the copper foil pattern with a bottom face coverlay 204; and bonding the top face coverlay 203 to the face of the base film 201 for recognition, wherein the top face coverlay 203 has the larger opening 203a formed therein than the copper foil pattern, wherein the bonding the top face coverlay 203 to the face of the base film 201 for recognition is performed such that the copper foil pattern is contained within the opening 203a.

Figure 5:
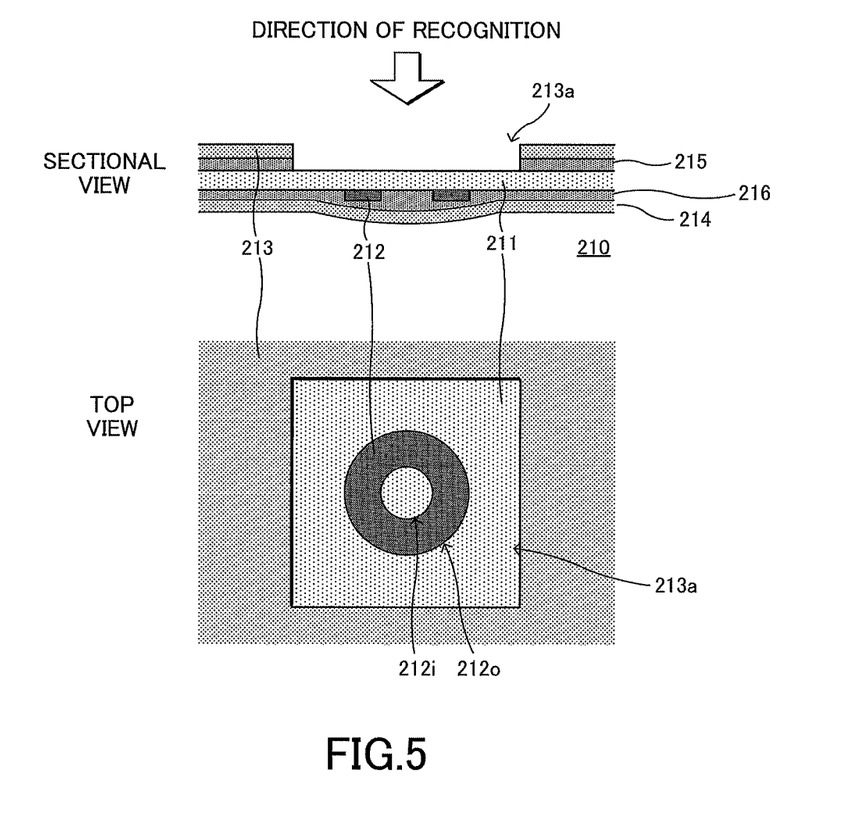
FIG. 5 shows another example for the recognition mark in the flexible printed board according to the second example.

While the recognition mark 202 as described above does not have an inner circumferential section, but only the outer circumferential section, the recognition mark may also have a hollow shape with an inner circumferential section and an outer circumferential section, similarly to the first example. FIG. 5 shows a flexible printed board 210 as another example for the second example, wherein the recognition mark 212 has a hollow shape with an inner circumferential section 212i and outer circumferential section 212o. The flexible printed board 210 is configured in a similar manner to the flexible printed board 200 according to the second example, except for the shape of the recognition mark 212.

This means that under the assumption that a face of the flexible printed board 210 for recognition of the recognition mark is a top face of the flexible printed board 210, the recognition mark 212 is formed on a bottom face side of the base film 211. The recognition mark 212 has a hollow shape with the inner circumferential section 212i and outer circumferential section 212o. While in the example according to FIG. 5, the outer circumferential section 212o and inner circumferential section 212i are concentrically circular, they may have different shapes, similarly to the first example. A face of the recognition mark 212 facing the base film 211 is in contact with the base film 211 in all regions of this face.

The recognition mark 212 is covered with a bottom face coverlay 214 on the entire surface of the recognition mark 212. The bottom face coverlay 214 is applied to a bottom face side of the base film 211 by means of a bottom face adhesive 216.

A top face coverlay 213 is applied to a top face side of the base film 211 by means of a to face adhesive 215. The top face coverlay 213 has a larger opening 203a formed therein than the recognition mark 212, wherein the recognition mark 212 can be recognized by viewing it through the base film 211 in a direction of recognition without viewing through the top face coverlay 213.

Figure 6:
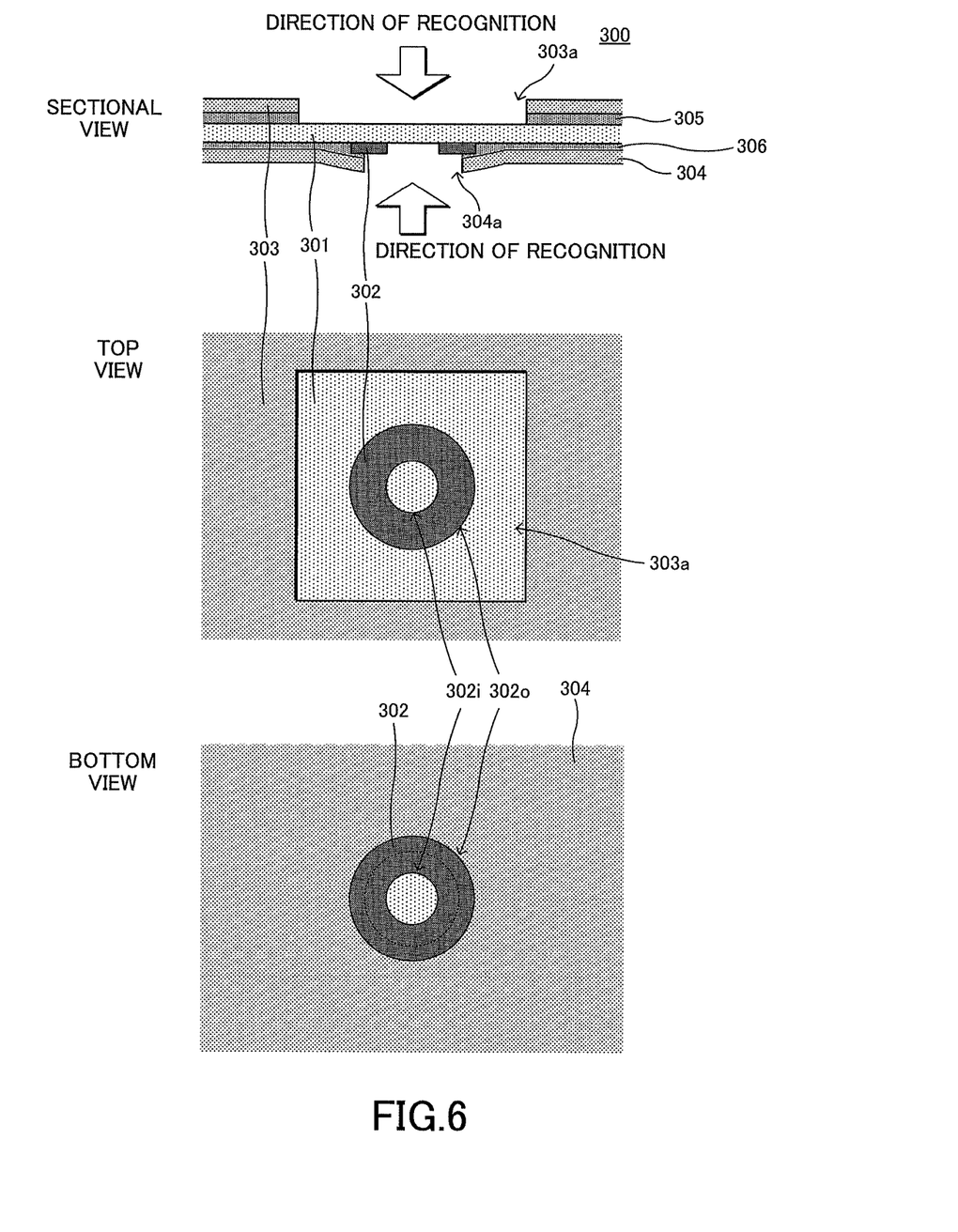
FIG. 6 is a recognition mark in a flexible printed board according to a third example.

Next, a third example of embodiments of the present invention will be described. FIG. 6 shows a top view and bottom view of a recognition mark 302 in a flexible printed board 300 according to the third example. As shown in this figure, the flexible printed board 300 according to the third example includes the recognition mark 302 which is formed in the form of a copper foil pattern on a base film 301 having an optical transmissivity. The recognition mark 302 has a hollow shape with the inner circumferential section 302i and outer circumferential section 302o.

While in the example according to FIG. 6, the outer circumferential section 302o and inner circumferential section 302i of the recognition mark 302 are concentrically circular, they may have different shapes, similarly to the first example. A face of the recognition mark 302 facing the base film 301 is in contact with the base film 301 in all regions of this face.

The recognition mark 302 in the flexible printed board 300 according to the third example can be recognized from the top face side as well as from the bottom face side. For the sake of convenience, a face of the base film 301 with the recognition mark 302 formed therein shall be referred to as a "bottom face".

A bottom face coverlay 304 is applied to the bottom face of the base film 301 by means of a bottom face adhesive 306. The bottom face coverlay 304 has an opening 304a formed therein, wherein the opening 303a is configured for exposing the inner circumferential section 302i of the recognition mark 302. With this opening 304a, the outer circumferential section 302o of the recognition mark 302 is covered with the bottom face coverlay 304 along the entire circumferential extension of the outer circumferential section 302o, in a similar manner to the first example. On the other hand, the inner circumferential section 302*i* is not covered with the bottom face coverlay 304 along the entire circumferential extension of the inner circumferential section 302*i*.

A top face coverlay 303 is applied to a top face of the base film 301 by means of a top face adhesive 305. The top face coverlay 303 has a larger opening 303*a* formed therein than the recognition mark 302 so that the recognition mark 302 can be recognized by viewing it through the base film 301 from above without viewing through the top face coverlay 303. The opening 303*a* is formed with some margin so that the recognition mark 302 is completely contained within the opening 303*a* when viewed through the base film 301. While in the example according to FIG. 6, the opening 303*a* has a rectangular shape, the opening 303*a* is not limited thereto, but may have a circular or polygonal shape or other.

The flexible printed board 300 according to the third example has a structure on the bottom face side which is similar to that of the face of the flexible printed board 100 for recognition according to the first example, wherein the recognition mark 302 is formed on the bottom face side. Therefore, when performing recognition of the recognition mark 302 from the bottom face side, a clear circle can be recognized in the inner circumferential section 302*i* portion of the recognition mark 302 which is not covered with the bottom face coverlay 304, which enables the recognition mark 302 to serve as a recognition mark with a high recognition accuracy. In addition, the outer circumferential section 302*o* of the recognition mark 302 is covered with the bottom face coverlay 304 along the entire circumferential extension of the outer circumferential section 302*o*, which enables the copper foil to be prevented from being stripped from the base film 301.

Moreover, the flexible printed board 300 according to the third example has a structure on the top face side which is similar to that of the face of the flexible printed board 200 for recognition according to the second example. In this manner, recognition of the recognition mark 302 from the top face side can be accomplished by viewing the recognition mark 302 through the base film 301 without viewing through the top face coverlay 303. Therefore, it is possible to recognize the recognition mark 302 clearly and prevent the recognition accuracy from being reduced.

Also according to the third example, it is possible to use a resin with an optical transmissivity for the base film 301, top face coverlay 303 and/or bottom face coverlay 304, such as a polyimide and/or polyester. It is provided that the recognition mark 302 is formed simultaneously with a circuit pattern of the flexible printed board 300, e.g. via copper etching. Furthermore, the opening 303*a* in the top face coverlay 303 and the opening 304*a* in the bottom face coverlay 304 are formed in advance before bonding it to the base film 301, e.g. by means of a laser cutter. According to the third example, it is possible to clearly recognize the recognition mark 302 from both sides, so that the third example is suited for the flexible printed board 300 with circuit patterns on both sides of the base film 301.

The flexible printed board 300 according to the third example may be produced according to the following steps: forming the copper foil pattern on a first face of the base film 301, the copper foil pattern having a hollow shape with the outer circumferential section 302*o* and the inner circumferential section 302*i*; and bonding a first face coverlay 304 having the opening 304*a* to the first face of the base film 301 so as to expose the inner circumferential section 302*i* of the copper foil pattern while covering the outer circumferential section 302*o*. bonding a second face coverlay 303 to a second face of the base film 301, wherein the second face coverlay 303 has the larger opening 303*a* formed therein than the copper foil pattern, wherein the bonding the second face coverlay 303 to the second face of the base film 301 is performed such that the copper foil pattern is contained within the opening 303*a*.

As described above, the flexible printed board according to examples of the embodiments is provided so that a recognized portion of the recognition mark is not covered with the coverlay, but a portion of the recognition mark other than the recognized portion is covered with the coverlay. This enables the copper foil pattern used as the recognition mark from being stripped from the base film while preventing the recognition accuracy of the recognition mark from being reduced.

REFERENCE SIGNS LIST

100 Flexible printed board
101 Base film
102 Recognition mark
103 Coverlay
104 Adhesive
200 Flexible printed board
201 Base film
202 Recognition mark
203 Top face coverlay
204 Bottom face coverlay
205 Top face adhesive
206 Bottom face adhesive
210 Flexible printed board
211 Base film
212 Recognition mark
213 Top face coverlay
214 Bottom face coverlay
215 Top face adhesive
216 Bottom face adhesive
300 Flexible printed board
301 Base film
302 Recognition mark
303 Top face coverlay
304 Bottom face coverlay
305 Top face adhesive
306 Bottom face adhesive

What is claimed is:

1. A flexible printed board comprising:
a base film with an optical transmissivity;
a copper foil pattern on a first face of the base film, all regions of a face of the copper foil pattern facing the base film being in contact with the base film, wherein the copper foil pattern is configured to function as a recognition mark;
a first face coverlay covering the copper foil pattern and bonded to the first face of the base film; and
a second face coverlay having a larger opening formed therein than the copper foil pattern, wherein the second face coverlay is bonded to a second face of the base film such that the copper foil pattern is contained within the opening when viewed through the base film,
wherein the copper foil pattern has a hollow shape with an outer circumferential section and an inner circumferential section,
wherein the first face coverlay has an opening formed therein and covers the outer circumferential section of the copper foil pattern such that an edge of the opening is positioned between the outer circumferential section and the inner circumferential section of the copper foil pattern, and wherein at least as much of the copper foil pattern is uncovered from the first face coverlay than is covered by the first face coverlay.

2. A method of producing the flexible printed board according to claim 1, the method comprising:
   forming the copper foil pattern on the base film, the copper foil pattern having a hollow shape with an outer circumferential section and an inner circumferential section; and
   bonding a coverlay having an opening to the base film so as to expose the inner circumferential section of the copper foil pattern while covering the outer circumferential section.

3. A method of producing the flexible printed board according to claim 1, the method comprising:
   forming the copper foil pattern on the first face of the base film with an optical transmissivity;
   covering the copper foil pattern with the first face coverlay and bonding the copper foil pattern to the first face of the base film; and
   bonding the second face coverlay to the second face of the base film, wherein the second face coverlay has a larger opening formed therein than the copper foil pattern, wherein the bonding the second face coverlay to the second face of the base film is performed such that the copper foil pattern is contained within the opening when viewed through the base film.

4. The flexible printed board according to claim 1, wherein the first face coverlay is directly bonded to both of the base film and the outer circumferential section of the copper foil pattern by an adhesive.

5. The flexible printed board according to claim 1, wherein the first face coverlay is extended to the edge from a portion of the base film that is beyond the copper foil pattern in a direction from the inner circumferential section to the outer circumferential section.

6. The flexible printed board according to claim 1, wherein a perimeter of the outer circumferential section of the copper foil pattern is a circle in shape, and
   wherein the perimeter is a portion of the copper foil pattern furthest away from the opening than any other portion of the copper foil pattern.

* * * * *